United States Patent [19]

Holderfield et al.

[11] Patent Number: 4,884,027
[45] Date of Patent: Nov. 28, 1989

[54] MANUAL MICROCIRCUIT DIE TEST SYSTEM

[75] Inventors: Daron C. Holderfield, Boaz; Bernard E. Martin, Huntsville, both of Ala.; Samuel S. Russell, Irmo, S.C.

[73] Assignee: The United States of America as represented by the Secretary of the Army, Washington, D.C.

[21] Appl. No.: 263,466

[22] Filed: Oct. 27, 1988

[51] Int. Cl.$^4$ .................... G01R 31/02; G01R 31/28
[52] U.S. Cl. .......................... 324/158 F; 324/73 R; 324/158 P
[58] Field of Search .......... 324/158 F, 158 P, 73 PC; 73/856.6; 374/208

[56] References Cited

U.S. PATENT DOCUMENTS

| | | | |
|---|---|---|---|
| 3,437,929 | 4/1969 | Glenn | 324/158 F |
| 3,710,251 | 1/1973 | Hagge et al. | 324/158 F |
| 3,979,671 | 9/1976 | Meeker et al. | 324/158 F |
| 4,590,422 | 5/1986 | Milligan | 324/158 P |
| 4,616,178 | 10/1986 | Thornton, Jr. et al. | 324/158 F |
| 4,755,746 | 7/1988 | Mallory et al. | 324/158 F |

Primary Examiner—Reinhard J. Eisenzopf
Assistant Examiner—Vinh P. Nguyen
Attorney, Agent, or Firm—James T. Deaton; Freddie M. Bush

[57] ABSTRACT

A system for testing semiconductor microchips is provided in which individual microchips can be tested electrically and under specific thermal conditions simultaneously to determine the reliability of the microchip under operating conditions. This system is unique and economically operable so as to enable all individual chips to be tested prior to mounting in larger assemblies.

11 Claims, 2 Drawing Sheets

MANUAL MICROCIRCUIT DIE TEST SYSTEM

DEDICATORY CLAUSE

The invention described herein was made in the course of or under a contract or subcontract thereunder with the Government and by a Government employee and may be manufactured, used, and licensed by or for the Government for governmental purposes without the payment to us of any royalties thereon.

CROSS REFERENCE TO RELATED APPLICATIONS

This application is related to applicants' co-pending application Ser. Nos.: 263,306 and 263,306 by Daron C. Holderfield, Bernard E. Martin, and Samuel S. Russell in that this invention utilizes the specific thermal test chamber device as disclosed in application Ser. No. 263,306 and the specific specimen holder and rotary assembly as disclosed in co-pending application Ser. No.: 263,305.

BACKGROUND OF THE INVENTION

In the past, alternate ways for determining the reliability of semiconductor chips or test specimens, (microcircuit die in their bare, non-incapulated form) have been used in modern military and space applications. Under conventional chip testing, reliability is determined using two industry standard procedures: (a) wafer probing where an array of chips on a wafer are probed at room temperature; and (b) statistical sampling with thermal stress.

Wafer probing technology has been the accepted way for chip testing where the microelectronic devices are electrically tested at room temperature. A wafer is usually four or five inches in diameter and contains and array of several chips of the same type. After probing, the wafer is scribed (cut) and separated and the individual chips are then available for use on the production floor. Wafer probing is a static test, meaning electrical continuity between critical circuit paths are verified, but total electrical function is not determined due to time constraints and associated cost. Thermal screening is not technically feasible since there is not a thermal forcing technique available that can rapidly cycle the large mass of a four or five inch wafer. Therefore, chip integrity is still questionable after wafer probing and damage incurred during the scribing process is evaluated only by visual inspection.

Statistical sampling is another industry accepted chip testing practice used to determine complete electrical functions and operating reliability, including MIL-SPEC temperature ranges. Under this methodology, one to two percent of the individual chips are separated from the wafer and mounted into a custom test fixture and subjected to dynamic electrical and thermal evaluation. Based upon the compiled test results, predictions are made concerning the other 98 to 99 percent of chips. And the chips which are used for test purposes are not usable after mounting in the test fixture.

Therefore, for the most part, chip reliability is unknown until they are assembled into the final electrical package (usually a Hybrid Microelectronic Assembly (HMA) which is used extensively in military and space applications), and the completed HMA package is subjected to MIL-SPEC final test. At this point in the manufacturing process non-functional HMA packages must undergo labor intensive troubleshooting to determine the cause of failure, and faulty chips must be removed and replaced per MIL-SPEC procedures. In many cases the cost of repairing a faulty HMA package exceeds the cost of producing the entire package.

Accordingly, it is an object of this invention to provide a test procedure that is economical enough that each semiconductor chip can be tested before assembling into a larger assembly such as a HMA.

Another object of this invention is to provide a system for testing semiconductor chips that enables the chip to be tested not only electrically but also under varied thermal conditions.

Still another object of this invention is to provide a system that enables a semiconductor chip to be tested both electrically and when the chip is in a pre-determined thermal condition.

Still another object of this invention is to provide a thermal screening system that can be used to satisfy military requirements as well as space industrial requirements.

Yet another object of this invention is to provide a system that is able to perform concurrent electrical/thermal testing of bare, individual semiconductor chips.

Still another object of this invention is to provide a system in which the electrical probing is of the nondestructive type.

Other objects and advantages of this invention will be obvious to those skilled in this art.

SUMMARY OF THE INVENTION

In accordance with this invention, a microcircuit die test system is provided in which individual microcircuit chips can be placed on a die mount and moved into a test position in which the individual microcircuit chip comes in contact with test probes and into a surrounding such that the chip can be quickly cycled through heating and cooling to simultaneously test the individual microcircuits electrically as well as at specific thermal conditions to determine the operability of the microcircuit chip under the selected test conditions.

DESCRIPTION OF THE PREFERRED EMBODIMENT

Figure 1:
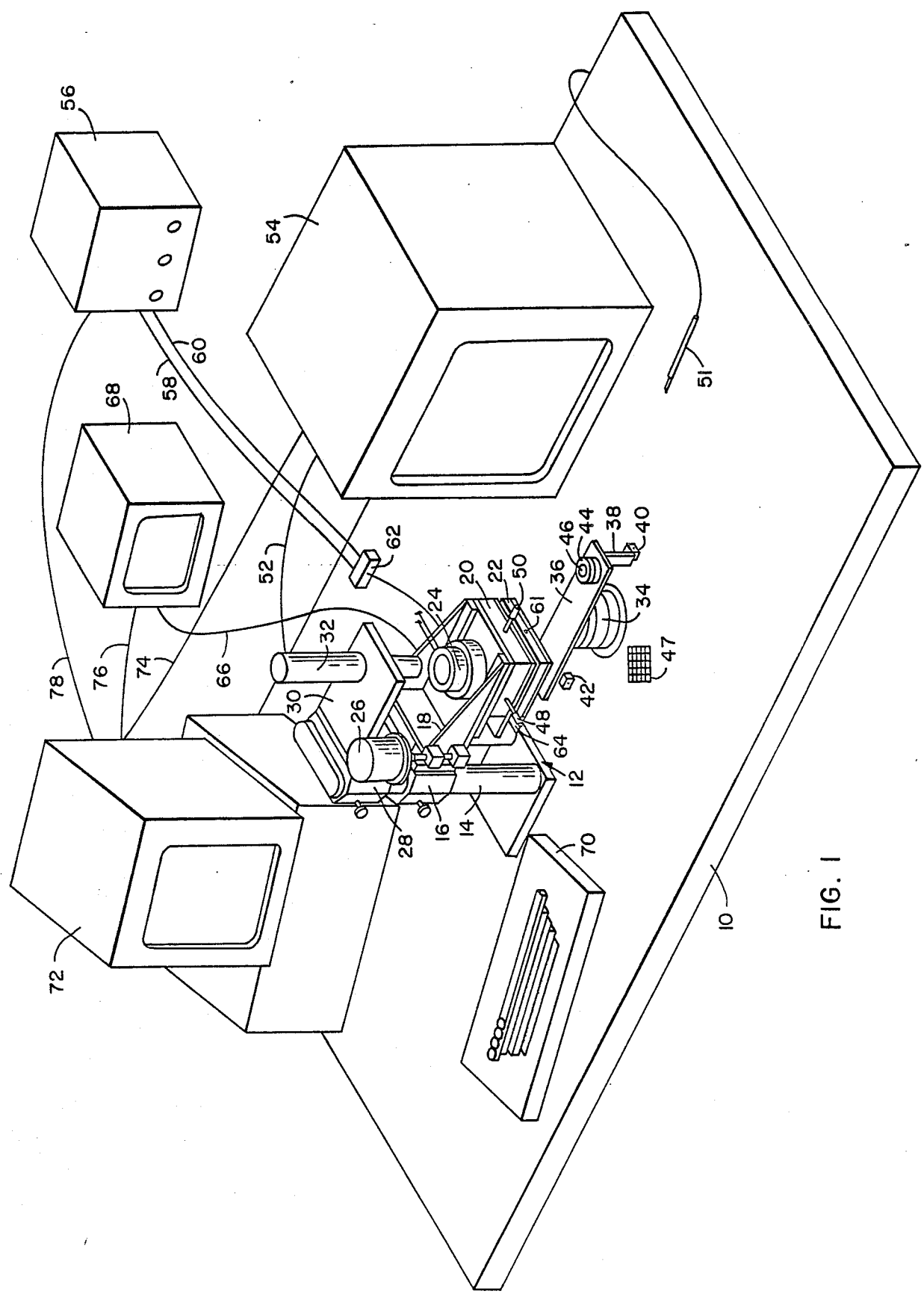
FIG. 1 is a plan view of the various elements of the system used in carrying out this invention.

Referring now to the drawings, the manual microcircuit die test system in accordance with this invention includes a base 10 upon which a stand 12 is securely mounted with a pair of uprights 14 with mounting structure 16 on uprights 14 to provide support for adjustable mounting means 18 which has x and y axes vernier adjusting means 20 secured thereto and a thermal test chamber 22 secured in a conventional manner to vernier adjusting means 20. A light source 24 for a video camera is mounted on an upper surface of adjustable support 18. A z axis electric motor vernier control 26 is provided for adjusting adjustable support 18 and the structures 20 and 22 up and down relative to the z axis. A support 28 is mounted relative to uprights 14 and has a projecting support member 30 that mounts video camera 32 in a conventional manner. Base 10 also has a rotary mount 34 of precision quality which has a rotary table 36 secured thereto in a conventional manner. Rotary table 36 has a arm 38 attached thereto for contacting electro-magnets 40 and 42 depending upon the rotary position of arm 38 to securely position and hold rotary table 36 in the position to which it is rotated. The adjusted positions of rotary table 36 are 180 degrees apart. Rotary table 36 has two die tables 44 with one of the die tables 44 at each end of rotary table 36. Each die table 44 has a mounting position 46 for mounting a semiconductor microchip thereon for testing. Holder 47 is provided with microchips and a vacuum pencil 51 is provided for picking up individual chips from holder 47 and placing them at 46 on the selected die table 44. Each die table 44 has a vacuum source attached thereto for maintaining and holding the semiconductor microchip in an exact position relative to position 46 of each die table. The details of the die table, rotary table and rotary mount are disclosed more specifically in applicants' co-pending application Ser. No. 263,305. Each of elements including light source 24, x and y adjusting means 20, and thermal test chamber device 22 have a light path there through to enable video camera 32 to look through each of these elements to a specimen mounted at 46 on die table 44 when die table 44 has been rotated to a position at a bottom opening to thermal test chamber 22. Thermal test chamber 22 has electrical probes that are designed to contact pads of the semiconductor microchip for testing circuits of the microchips. Electric motor adjusting means 26 is provided for raising and lowering adjustable mount 18 and the probes of thermo test chamber 22 up and down relative to a semiconductor microchip mounted on die table 44. More complete details of thermo test chamber 22 is disclosed in applicants co-pending application Ser. No. 263,306. Vernier adjusting means 20 has y axis vernier adjustment 48 and x axis vernier adjustment 50 for adjusting thermal test chamber 22 and the probes at the base thereof relative to the semiconductor microchip on die table 44 to insure that the test probes are in the exact position relative to the semiconductor chip that is to be tested.

Figure 2:
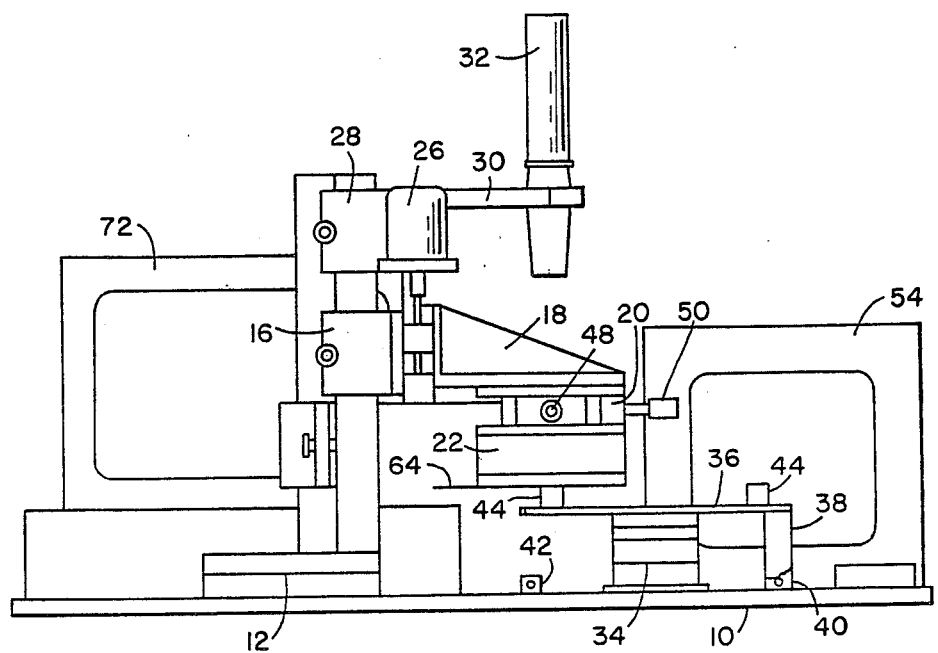
FIG. 2 is a side view illustrating elements of the invention in a particular testing relationship.
Figure 3:
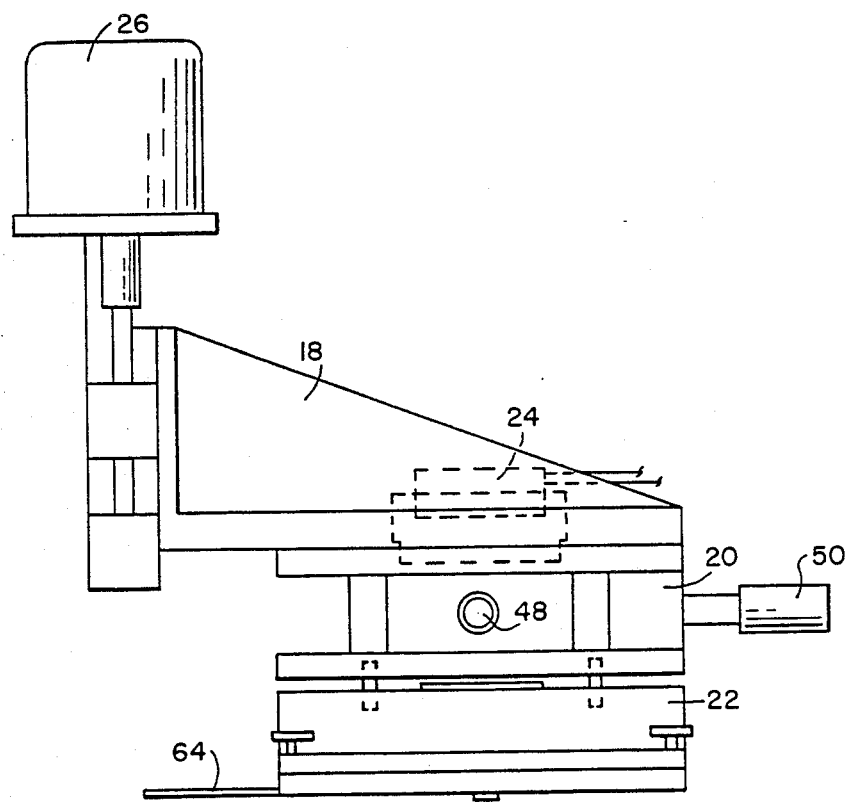
FIG. 3 is a side view illustrating in more detail the structure of the x and y axes adjusting means and the thermal test chamber device.

Video camera 32 has its output connected through cable 52 to video monitor 54 for displaying the position of the probes of test chamber 22 relative to the chip on die table 44. A thermal unit 56 is used to provide heating through line 58 and cooling through line 60 to a manifold control 62 that is connected to an input to thermal chamber device 22 to heat or cool the micro-chip on die table 44 when it is being tested. Thermal test chamber 22 has outlets 61 on opposite sides for continually exhausting media, there from as it is being supplied by manifold control 62. Thermal test chamber device 22 also has electrical leads 64 at one side thereof as illustrated in FIGS. 2 and 3 and these leads are connected by cable 66 (see FIG. 1) to electrical test control equipment 68.

A keyboard 70 is provided for personal computer 72 that is used to signal and control video monitor 54, thermal supply unit 56 and electrical test unit 68. Personnel computer 72 is connected by cables 74, 76, and 78 to units 54, 56 and 58 respectively.

In operation, when it is desired to test microchips, vacuum pencil, 51 is used to pick up a microchip and place it on test position 46 which is a right angle cutout that the microchip is precisely inserted into and then a vacuum is pulled on a port in support 44 for holding the microchip in position. Rotary table 36 is then rotated 180 degrees and electro-magnet 42 is energized to hold rotary table 36 in an exact position. Next, keyboard 70 is utilized to direct computer 72 to cause each of elements 54, 56 and 58 to be placed in a standby position and to energize electric motor adjusting means 26 to lower thermal test chamber device 22 relative to die table 44 to position probes of thermal test chamber 22 relative to the semiconductor microchip on die table 44. The chip and probes are viewed on the screen of video monitor 54 and if each of the probes do not perfectly match with the pads of the microchip to be tested, x and y axes vernier adjustments 50 and 48 are used to accurately position the test probes as they are being viewed on the screen of device 54. Also, the z axis can be further adjusted by motor 26 and die table 44 can also be adjustably rotated if needed to adjust the chip and probes relative to each other. When these adjustments are complete, computer 72 signals control of manifold control 62 to cause the appropriate heating or cooling medium to be supplied to a chamber of thermal test chamber 22 to inject the media directly onto the semiconductor microchip to be tested to cause the chip to assume the temperature desired and to continuously exhaust media at outlets 61. Once the desired temperature is attained, computer 72 is caused to direct test unit 68 to perform the test cycle desired for the semiconductor microchip that is being tested and the test results are recorded. Next, computer 72 is caused to signal manifold control 62 to provide the next media temperature desired to be supplied for the semiconductor microchip being tested to cause the microchip to assume the temperature of this media and then after this temperature is obtained, electrical circuit test unit 68 is again directed to perform its test. This cycle is repeated until the various temperatures desired for test of the test specimen have been completed. Electrical test unit 68 produces a signal which tells the results of the test after each thermal cycling of the specimen. A particular test cycle for a semiconductor microchip in accordance with military specifications can be temperatures at ambulant or plus 25 degrees Celcius, minus 55 degrees Celcius and plus 125 degrees Celcius. Obviously, other temperatures can be used as desired for the testing of a particular microchip. When the test cycle has been completed, computer 72 signals electric motor 26 and raises adjustable support 18 and thermal test chamber 22 connected thereto to clear die table 44 to allow rotary table 36 to be rotated. While the test procedure is being performed on the semiconductor microchip specimen another semiconductor microchip from holder 47 is placed on the opposite die table 44 to make it ready for testing when rotated 180 degrees and the complete cycle repeated for the next specimen. This cycle of operation is repeated until all the semiconductor test specimens desired to be tested are completed.

As will be appreciated, applicants' system can readily be used to verify the integrity and reliability of semiconductor microchips prior to their being released for use in production models. Applicants' system can be used to screen 100 percent of all semiconductor microchips or it can be alternatively used to test a statistical sampling. Either approach, has a considerable economical advantage over current ways of testing devices of this nature and provides an ultimate way to verify individual semiconductor microchip reliability without destroying the chips tested.

We claim:

1. A microcircuit die test system comprising: a die table with means thereon for accurately mounting a test specimen, means for positioning said die table in a position for testing, a test chamber device having means for being positioned relative to said die table to enable electrical test to be made of the test specimen, means for injecting media onto the test specimen to subject the test specimen to selected temperatures, means for positioning the test chamber device relative to said die table, means mounted relative to said test chamber device for adjusting said test chamber device in x and y axes, and means for viewing through said test chamber device to the specimen on said die table.

2. A microcircuit die test system as set forth in claim 1, wherein said means for positioning said die table includes a rotatably mounted rotary table with two of said die tables located on opposite ends of said rotary table, and electro-magnetic means for holding said rotary table in predetermined positions that are 180 degrees apart with one of said die tables being mounted in said test position.

3. A microcircuit die test system as set forth in claim 2, wherein said means for positioning said test chamber includes an electric motor means for moving said test chamber device up and down about a z axis.

4. A microcircuit die test system as set forth in claim 3, wherein said means for viewing includes a video camera mounted relative to said test chamber device and said video camera being connected to a video monitor for monitoring the specimen on said die table.

5. A microcircuit die test system as set forth in claim 4, wherein said test chamber device includes an opening for introduction of media therein and outlet ports for exhausting said media.

6. A microcircuit die test system as set forth in claim 5, wherein said test chamber device has electrical leads leading there from and connected to an electrical test control equipment for conducting electrical test on the specimen.

7. A microcircuit die test system as set forth in claim 6, wherein a computer is provided and is connected to said video monitor, said means for injecting said media, and said test control equipment for controlling each of these items as commanded to perform the task of each of these items.

8. A microcircuit die test system as set forth in claim 7, wherein said means for positioning has a light source mounted thereon for said video camera.

9. A system for testing a microchip comprising: means for mounting the microchip in a predetermined position, a test chamber device including electrical means for testing the microchip, thermal means for adjusting the test temperature of the microchip; and means mounting said test chamber device for movement into an adjusted position in engagement with said means for mounting the microchip to enable said microchip to be electrically tested and have the temperature of the microchip adjusted to a plurality of different temperatures.

10. A system for testing a microchip as set forth in claim 9, wherein said test chamber device has means mounted relative thereto to enable viewing of the microchip when in the testing position.

11. A system for testing a microchip as set forth in claim 10, wherein said viewing means includes a video camera mounted for viewing the microchip.

* * * * *